United States Patent
Nguyen et al.

(10) Patent No.: US 10,002,882 B2
(45) Date of Patent: Jun. 19, 2018

(54) METHOD FOR MANUFACTURING A HIGH-RESISTIVITY SEMICONDUCTOR-ON-INSULATOR SUBSTRATE INCLUDING AN RF CIRCUIT OVERLAPPING A DOPED REGION IN THE SUBSTRATE

(71) Applicant: Soitec, Bernin (FR)

(72) Inventors: Bich-Yen Nguyen, Austin, TX (US); Frederic Allibert, Albany, NY (US); Christophe Maleville, Laterasse (FR)

(73) Assignee: Soitec, Bernin (FR)

( * ) Notice: Subject to any disclaimer, the term of this patent is extended or adjusted under 35 U.S.C. 154(b) by 0 days. days.

(21) Appl. No.: 15/176,925

(22) Filed: Jun. 8, 2016

(65) Prior Publication Data

US 2016/0372484 A1    Dec. 22, 2016

(30) Foreign Application Priority Data

Jun. 17, 2015    (DE) .......................... 10 2015 211087

(51) Int. Cl.
*H01L 21/425*    (2006.01)
*H01L 27/12*    (2006.01)
(Continued)

(52) U.S. Cl.
CPC ........ *H01L 27/1203* (2013.01); *H01L 21/266* (2013.01); *H01L 21/26506* (2013.01);
(Continued)

(58) Field of Classification Search
CPC ... H01L 27/1203; H01L 21/84; H01L 21/266; H01L 21/265; H01L 23/66; H01L 21/26506; H01L 21/26533
(Continued)

(56) References Cited

U.S. PATENT DOCUMENTS 6,265,248 B1    7/2001    Darmawan et al.
7,109,553 B2    9/2006    Matsumoto et al.
(Continued)

FOREIGN PATENT DOCUMENTS

DE    112009001477 T5    4/2011
JP    2000353797    12/2000
(Continued)

OTHER PUBLICATIONS

German Search Report for German Application No. 102015211087.7 dated Feb. 22, 2016, 12 pages.
(Continued)

*Primary Examiner* — Joseph C Nicely
*Assistant Examiner* — Wilner Jean Baptiste
(74) *Attorney, Agent, or Firm* — TraskBritt

(57) ABSTRACT

A method for manufacturing a high-resistivity semiconductor-on-insulator substrate comprising the steps of: a) forming a dielectric layer and a semiconductor layer over a high-resistivity substrate, such that the dielectric layer is arranged between the high-resistivity substrate and the semiconductor layer; b) forming a hard mask or resist over the semiconductor layer, wherein the hard mask or resist has at least one opening at a predetermined position; c) forming at least one doped region in the high-resistivity substrate by ion implantation of an impurity element through the at least one opening of the hard mask or resist, the semiconductor layer and the dielectric layer; d) removing the hard mask or resist; and e) forming a radiofrequency (RF) circuit in and/or on the semiconductor layer at least partially overlapping the at least one doped region in the high-resistivity substrate.

10 Claims, 4 Drawing Sheets

(51) Int. Cl.
  *H01L 21/265* (2006.01)
  *H01L 21/84* (2006.01)
  *H01L 21/266* (2006.01)
  *H01L 23/66* (2006.01)

(52) U.S. Cl.
  CPC ........ *H01L 21/26533* (2013.01); *H01L 21/84* (2013.01); *H01L 23/66* (2013.01)

(58) Field of Classification Search
  USPC ........................................................ 438/527
  See application file for complete search history.

(56) References Cited

U.S. PATENT DOCUMENTS

| | | | |
|---|---|---|---|
| 8,492,868 | B2 | 7/2013 | Botula et al. |
| 8,951,896 | B2 | 2/2015 | Botula et al. |
| 2003/0223258 | A1 | 12/2003 | Wei et al. |
| 2004/0002197 | A1* | 1/2004 | Fathimulla ........ H01L 21/76254 438/455 |
| 2008/0217727 | A1* | 9/2008 | Kjar ...................... H01L 21/765 257/499 |
| 2010/0009527 | A1* | 1/2010 | Lee .................. H01L 21/26513 438/527 |
| 2012/0161310 | A1 | 6/2012 | Brindle et al. |
| 2012/0313173 | A1* | 12/2012 | Dickey ............... H01L 27/1203 257/347 |
| 2013/0009725 | A1* | 1/2013 | Heaney ................... H01L 21/84 333/103 |
| 2013/0181290 | A1* | 7/2013 | Hurwitz .............. H01L 21/7624 257/347 |
| 2014/0084290 | A1 | 3/2014 | Allibert et al. |
| 2014/0175610 | A1* | 6/2014 | Zhang ................ H01L 27/0248 257/546 |
| 2014/0246751 | A1 | 9/2014 | Cheng et al. |

FOREIGN PATENT DOCUMENTS

| | | |
|---|---|---|
| JP | 2001308273 | 11/2001 |
| JP | 2002026137 | 1/2002 |
| JP | 2004207271 | 7/2004 |
| JP | 2012517691 | 8/2012 |
| JP | 2012174884 | 9/2012 |
| JP | 2013507873 | 3/2013 |
| JP | 2013537715 | 10/2013 |
| JP | 2014504457 | 2/2014 |
| TW | 201241877 A | 10/2012 |
| WO | 2011045442 | 4/2011 |

OTHER PUBLICATIONS

Botula et al, A Thin-film SOI 180nm CMOS RF Switch Technology, Silicon Monolithic Integrated Circuits in RF Systems, IEEE Topical Meeting, Jan. 19-21, 2009, pp. 1-4.
Burghartz et al, Surface-Passivated High-Resistivity Silicon as a True Microwave Substrate, IEEE Transactions on Microwave Theory and Techniques, vol. 53, No. 7, Jul. 2005, pp. 2340-2347.
European Search Report for EP Application No. 16168605, dated Nov. 8, 2016, 4 pages.
Japanese Office Action for JP Application No. 2016-098789, dated Feb. 7, 2017, 8 pages.
Kerr et al, Identification of RF Harmonic Distortion on Si Substrates and its Reduction Using a Trap-Rich Layer, IEEE Xplore Conference: Silicon Monolithic Integrated Circuits in RF Systems, Feb. 2008, pp. 151-154.
Sekar et al, Comparison of Substrate Effects in Sapphire, Trap-Rich and High Resistivity Silicon Substrates for RF-SOI Applications, 2015 IEEE 15th Topical Meeting on Silicon Monolithic Integrated Circuits in RF Systems, Silicon Monolithic Integrated Circuits in RF Systems (SiRF), 2015 IEEE 15th Topical Meeting, Jan. 26, 2015, pp. 37-39.
Japanese Office Action for Japanese Application No. P2016-098789 dated Jul. 11, 2017, 7 pages.
Japanese Final Office Action for Japanese Application No. P2016-098789, dated Mar. 16, 2018, 16 pages.
Korean Office Action for Korean Application No. 10-2016-0075796, dated Feb. 27, 2018, 8 pages.

* cited by examiner

METHOD FOR MANUFACTURING A HIGH-RESISTIVITY SEMICONDUCTOR-ON-INSULATOR SUBSTRATE INCLUDING AN RF CIRCUIT OVERLAPPING A DOPED REGION IN THE SUBSTRATE

CROSS-REFERENCE TO RELATED APPLICATION

This application claims the benefit of the filing date of German Patent Application Serial No. 102015211087.7, filed Jun. 17, 2015, titled "METHOD FOR MANUFACTURING A HIGH-RESISTIVITY SEMICONDUCTOR-ON-INSULATOR SUBSTRATE."

TECHNICAL FIELD

The present disclosure relates to a method for manufacturing a high-resistivity (HR) semiconductor-on-insulator (SOI) substrate, to a high-resistivity semiconductor-on-insulator substrate obtained via such a method, and to a semiconductor device.

BACKGROUND

Complex semiconductor substrates may be manufactured by combining two or more layers. One class of such engineered substrates is semiconductor-on-insulator substrates, wherein a top semiconductor layer is formed over a carrier substrate with a dielectric layer in between. For the top semiconductor layer and the carrier substrate, silicon is usually used and the dielectric layer is usually an oxide layer, typically a silicon oxide.

Especially so-called high-resistivity (HR) substrates are currently investigated for use for radiofrequency (RF) applications due to their reduced substrate loss and coupling.

It has been found, however, that between the high-resistivity substrate and the thin dielectric layer, a so-called parasitic conduction layer can be formed, compromising the RF performance, particularly the expected benefits in substrate loss and coupling.

Various solutions for this problem have been proposed. For instance, a continuous trap-rich layer under the buried oxide layer has been suggested ("Identification of RF Harmonic Distortion on Si Substrates and its Reduction Using a Trap-Rich Layer" by Kerr, et al., IEEE, 2008). This single trap-rich layer, however, has negative effects connected to the back gate formation process. Particularly, due to a larger lateral doping diffusion and a high interface trap density in the back gate, a problem of variability and, thus, of reliability of the obtained structure may arise.

Furthermore, from U.S. Pat. No. 8,492,868, a method of forming an integrated circuit structure is known, wherein a silicon substrate layer is formed having trench structures and an ion impurity implant. An insulator layer is then positioned on and contacts the silicon substrate layer, wherein the insulator layer also fills the trench structures. A circuitry layer is then positioned on and contacts the buried insulator layer. The ion impurity implant allows avoiding the above-mentioned parasitic conduction layer. Since this method first forms trenches in the substrate and then the buried oxide layer on the substrate; however, the subsequent formation of the semiconductor layer on the buried oxide layer may be complicated. Furthermore, this teaching does not account for the co-integration of, for instance, digital circuits.

BRIEF SUMMARY

It is, therefore, the object of the present disclosure to provide an improved method for manufacturing a high-resistivity semiconductor-on-insulator substrate, a correspondingly improved high-resistivity semiconductor-on-insulator substrate, and an improved semiconductor device comprising such a high-resistivity semiconductor-on-insulator substrate.

This object may be achieved with a method comprising the steps of: a) forming a dielectric layer and a semiconductor layer over a high-resistivity substrate, such that the dielectric layer is arranged between the high-resistivity substrate and the semiconductor layer; b) forming a hard mask or resist over the semiconductor layer, wherein the hard mask or resist has at least one opening at a predetermined position; c) forming at least one doped region in the high-resistivity substrate by ion implantation of an impurity element through the at least one opening of the hard mask or resist, the semiconductor layer and the dielectric layer; d) removing the hard mask or resist; and e) forming a radiofrequency (RF) circuit in and/or on the semiconductor layer at least partially overlapping the at least one doped region in the high-resistivity substrate.

This object may also be achieved with a high-resistivity semiconductor-on-insulator substrate obtained by such a method.

This object may also be achieved with a semiconductor device comprising: a high-resistivity substrate; a dielectric layer over the high-resistivity substrate; and a semiconductor layer over the dielectric layer; wherein the semiconductor layer comprises a radiofrequency, RF, circuit and a digital and/or analog circuit; wherein the high-resistivity substrate comprises at least one doped region at least partially overlapping the radiofrequency, RF, circuit; and wherein the digital circuit and/or the analog circuit are arranged in and/or on the semiconductor layer in an area not overlapping the at least one doped region in the high-resistivity substrate.

By using a local implantation through the semiconductor layer and the dielectric layer using a hard mask or resist, it is possible to form a localized trap-rich region in the high-resistivity substrate. In particular, it is possible to form the trap-rich region under the RF circuit only. This trap-rich region can avoid the above-mentioned parasitic conduction layer below the RF circuit, so that the RF performance is not diminished. Additional analog or digital portions of a circuit may be provided, below which, however, no trap-rich region is formed. This can be particularly beneficial as the digital/analog portions often require an efficient back biasing. For achieving such an efficient back biasing, a trap-rich layer below the digital/analog portions would have disadvantages.

The present disclosure, thus, also provides the use of a localized doped layer in a high-resistivity semiconductor-on-insulator substrate below an RF circuit to avoid formation of a parasitic conduction layer between the high-resistivity substrate and the dielectric layer in the region below the RF circuit, wherein the localized doped layer is formed by ion implantation of an impurity element through an opening of a hard mask or resist, through the semiconductor layer and through the dielectric layer.

BRIEF DESCRIPTION OF THE DRAWINGS

Advantageous embodiments will now be described in combination with the following figures.

DETAILED DESCRIPTION

Figure 1:
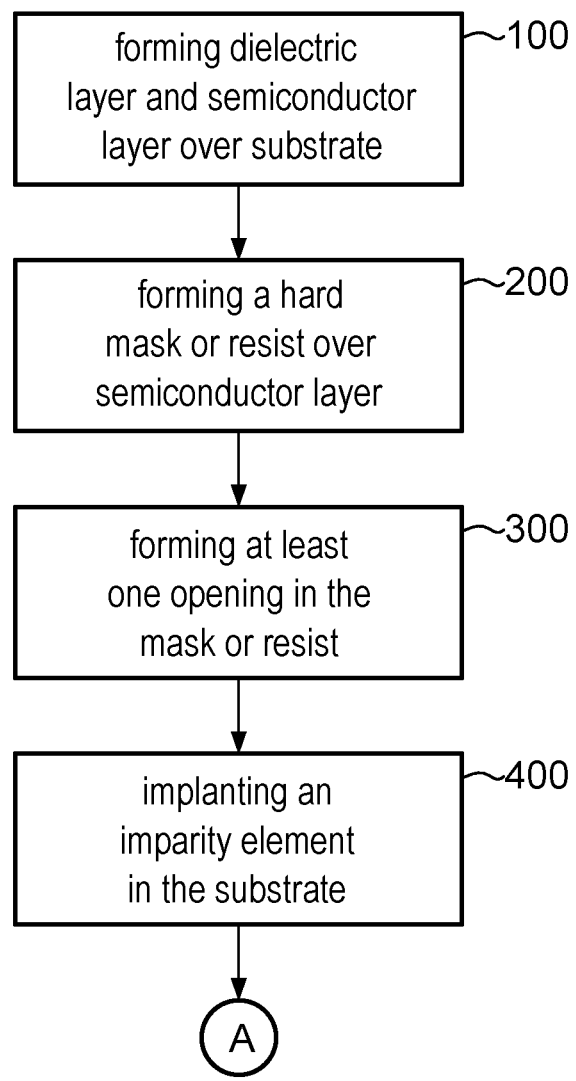
FIG. 1 shows a simplified flowchart of the method according to the present disclosure.

An exemplary method for manufacturing a high-resistivity semiconductor-on-insulator substrate, particularly with an RF circuit, shall now be described with reference to FIG. 1.

First, in step 100, a dielectric layer and a semiconductor layer are formed over a substrate. The substrate is a high-resistivity substrate. The high-resistivity substrate may comprise silicon, in particular, polycrystalline silicon and/or single-crystal silicon. The resistivity of the high-resistivity substrate may be 1 k$\Omega$·cm or higher.

At least a part of the high-resistivity substrate may be compatible with being used as a back gate, particularly after being doped. In particular, an upper part of the high-resistivity substrate, i.e., a part of the high-resistivity substrate facing toward the semiconductor layer, may be compatible with being used as a back gate, particularly after being doped.

To form a back gate, doping of the high-resistivity substrate may be performed, for instance, using arsenic or boron as a dopant.

The semiconductor layer may also comprise silicon. The dielectric layer may correspond to a buried oxide (BOX) layer and may particularly comprise a silicon oxide ($SiO_2$).

Other materials for the above-mentioned layers are possible as well. For instance, Germanium (Ge), Silicon-Germanium (SiGe) or III-V compounds may be used, in particular, for the semiconductor layer. The high-resistivity substrate does not need to be entirely composed of a semiconductor. It is possible to form only the upper part, i.e., the part facing toward the semiconductor layer, of a material having the ability to be switched from high-resistivity to low-resistivity, particularly through an implant or dopant.

The BOX layer can be any insulating material, including deposited low-k dielectrics (as used in the back end of line (BEOL)), or even high-k dielectrics (e.g., Hafnium (IV) oxide ($HfO_2$)).

The dielectric layer and the semiconductor layer may be formed over the high-resistivity substrate using any known technology, for instance, using a "SMART CUT®" technique.

In the "SMART CUT®" technique, the dielectric layer and/or the semiconductor layer are transferred to the high-resistivity substrate from a donor substrate. After forming the dielectric layer on the donor substrate comprising the semiconductor material of the semiconductor layer, a predetermined splitting area inside the donor substrate is formed. The predetermined splitting area is formed by an ion implantation step, during which ions like hydrogen or rare gas ions (helium, argon, etc.) are implanted into the donor substrate. The depth of the predetermined splitting area can be determined by the energy of the implanted ions. After attaching, in particular by bonding, the donor substrate to the high-resistivity substrate (also referred to as a "handle substrate"), a mechanical and/or thermal treatment is performed, such that a detachment of a semiconductor layer, together with the buried dielectric layer, occurs at the predetermined splitting area so that the two layers are transferred onto the high-resistivity substrate.

After the dielectric layer and a semiconductor layer are formed over the high-resistivity substrate, a hard mask or resist is formed over the semiconductor layer in step 200.

In step 300, at least one opening may be formed in the hard mask or resist at a predetermined position. The at least one opening may be formed by known techniques, such as lithography techniques or by etching. The at least one opening may be formed to specify or cover a predetermined area. In particular, the at least one opening may be rectangular, having a predetermined width and length.

The predetermined position at which the at least one opening is formed may particularly correspond to the position at which an RF circuit, including active and passive devices, is formed. The size of the at least one opening may be adapted to the size of the RF circuit.

The hard mask or resist may particularly cover those regions of the semiconductor layer that are intended to include analog and/or digital circuits at a later step of the processing of the semiconductor substrate.

In step 400, ion implantation of an impurity element is performed through the at least one opening of the hard mask or resist, through the semiconductor layer, and through the dielectric layer, to form at least one doped region in the high-resistivity substrate. The impurity element may particularly comprise carbon (C), germanium (Ge), oxygen (O), silicon (Si), argon (Ar), molybdenum (Mo) and/or fluorine (F). More generally, the impurity element may comprise any element that fulfils one or more of the following:

Generates deep-level states in silicon while having a very low diffusivity.

Has the ability to amorphize the silicon without being electrically active.

Has the ability to convert the silicon into a (semi)-insulating material.

The doping energy may be selected depending on the thickness of the dielectric layer and the semiconductor layer, as well as on the impurity element. Similarly, the dose may depend on the operating conditions and may be more than $1 \times 10^{11}$ cm$^{-2}$ or more than $1 \times 10^{13}$ cm$^{-2}$.

The at least one doped region in the high-resistivity substrate, thus, may particularly correspond to a trap-rich region arranged at the predetermined position. The lateral extension of the doped region corresponds to the area of the at least one opening. In other words, the at least one doped region is localized at the predetermined position with a predetermined size, particularly an area as defined by the size of the at least one opening and particularly a depth depending on the energy and dose used during the ion implantation step.

The predetermined position can particularly be specified by two coordinates when viewing the semiconductor substrate from the top. The predetermined position of the opening may then correspond to the coordinates of one of the corners or of the center of the opening.

Figure 2:
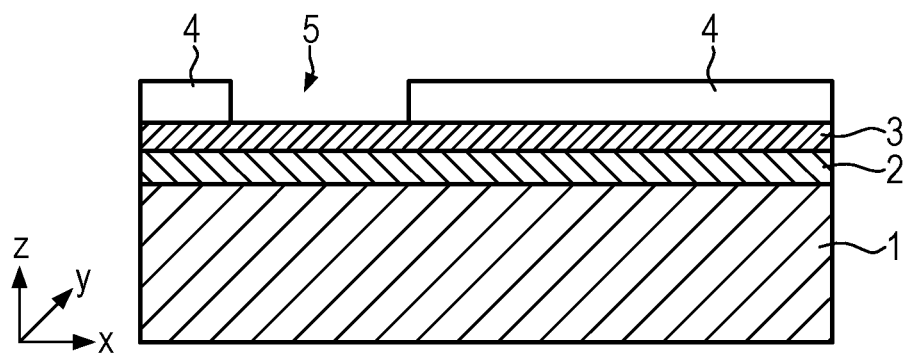
FIG. 2 illustrates an intermediate step of the manufacturing method according to the present disclosure.

FIG. 2 illustrates an exemplary intermediate step of a high-resistivity semiconductor-on-insulator substrate obtained during the manufacturing method. The illustrated high-resistivity semiconductor-on-insulator substrate includes a high-resistivity substrate 1, a buried oxide layer 2, and a semiconductor layer 3, arranged in this order. Furthermore, a hard mask or resist 4 is formed over the semiconductor layer 3, which includes an opening 5 at a predetermined position, i.e., at predetermined X and Y coordinates. The opening 5 may have a predetermined geometry and size.

Figure 3:
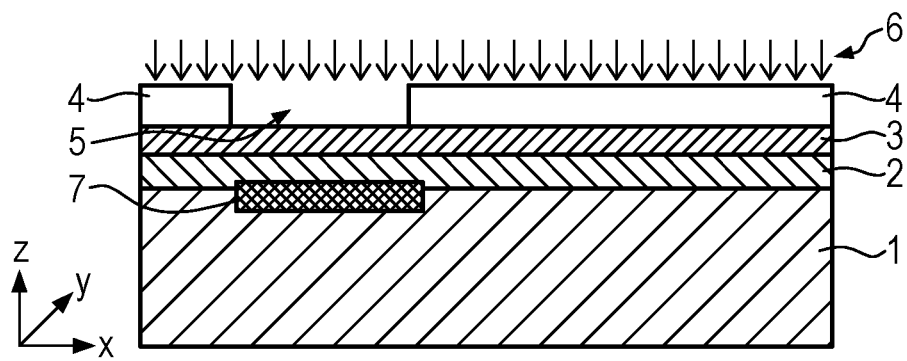
FIG. 3 illustrates another intermediate step of the method according to the present disclosure.

FIG. 3 illustrates the subsequent manufacturing step, wherein ion implantation with impurity elements 6 is performed through the opening 5, the semiconductor layer 3, and the buried oxide layer 2 to form a doped region 7 in the substrate 1. The doped region 7 is formed at the predetermined position, in other words, at the same X and Y coordinates as the opening 5 in the hard mask or resist 4. The doped region 7 has the same geometry and (lateral) size as the opening 5. In this way, thus, a localized trap-rich region is formed.

The method steps as illustrated in FIG. 1 may particularly be performed in the specified order. This temporal order allows for an efficient alignment of the implanted regions and the subsequently formed RF circuit. Even a self-alignment may be achieved in this way. Furthermore, generic semiconductor-on-insulator substrates can be formed in this way, which can be patterned according to a selected mask or resist rather than implementing the semiconductor-on-insulator fabrication during the device integration sequence. This increases the flexibility and the cost efficiency.

Figure 4:
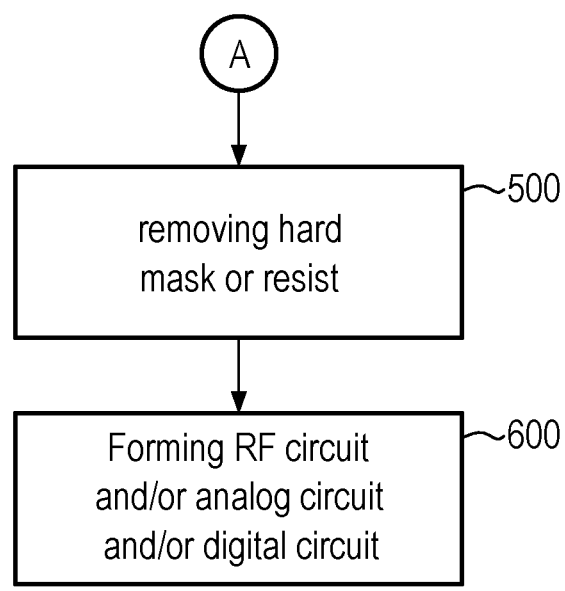
FIG. 4 illustrates further steps of the method according to the present disclosure.

FIG. 4 illustrates further steps that may be performed after step 400 of FIG. 1. Particularly in step 500, the hard mask or resist may be removed. This removal can be performed by known techniques, such as etching.

In step 600, a radiofrequency (RF) circuit, particularly comprising active and/or passive devices, may be formed at the predetermined position; in other words, above the doped region 7. The RF circuit, thus, at least partially overlaps the doped region 7 when viewed from above (from the side on which the RF circuit is arranged). The RF circuit may particularly overlap the doped region 7 completely. In other words, the RF circuit may be aligned with the doped region 7 in a vertical direction.

Analog circuits and/or digital circuits may be formed that do not overlap with the doped region 7. The above-described method thus allows a co-integration of radiofrequency circuits and analog and/or digital circuits. Since the doped region 7 is not formed below the analog and/or digital circuits, an efficient back biasing is possible.

As used herein, an active device is a device that can be switched on and off. For instance, an active device may comprise or correspond to a transistor. A passive device may comprise or correspond to a transmission line, an inductor, or a resistor.

Figure 5:
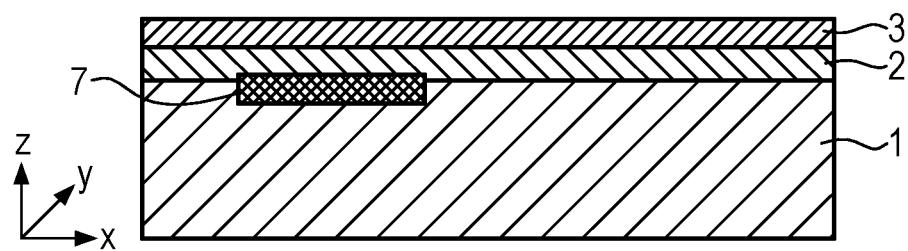
FIG. 5 illustrates an exemplary semiconductor substrate according to the present disclosure.

In FIG. 5, a high-resistivity semiconductor-on-insulator substrate obtained as an intermediate product during a method as described above is shown. It includes a high-resistivity substrate 1, a dielectric layer 2 over the high-resistivity substrate 1, and a semiconductor layer 3 over the dielectric layer 2. A doped region 7 is formed in the high-resistivity substrate 1 at a predetermined position. The doped region 7 particularly comprises carbon (C), germanium (Ge), oxygen (O), and/or fluorine (F), particularly incorporated into polycrystalline or single-crystal silicon of the high-resistivity substrate 1.

Figure 6:
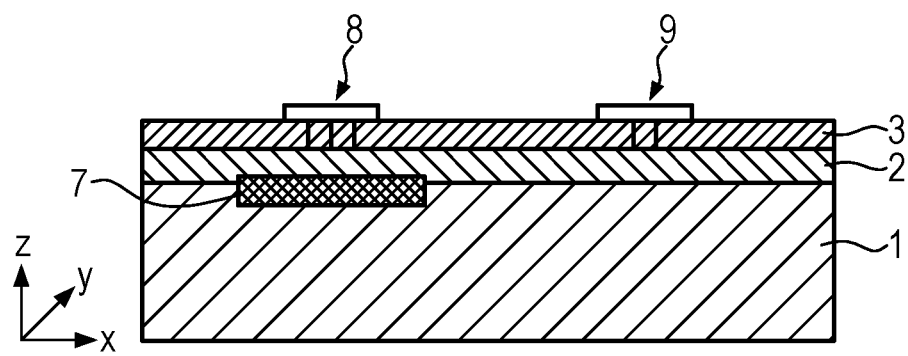
FIG. 6 illustrates an exemplary semiconductor device according to the present disclosure.

FIG. 6 illustrates a semiconductor device comprising a semiconductor substrate as illustrated in FIG. 5. Additionally, an RF circuit 8 is formed in and/or on the semiconductor layer 3 over the doped region 7, i.e., at least partially overlapping the doped region 7. Moreover, an analog circuit or digital circuit 9 is similarly formed in and/or on the semiconductor layer 3 in an area or at a position where no doped region is provided below in the high-resistivity substrate 1.

Although the previously discussed embodiments and examples of the present disclosure have been described separately, it is to be understood that some or all of the above-described features can also be combined in different ways. The discussed embodiments are not intended as limitations, but serve as examples illustrating features and advantages of the present disclosure.

What is claimed is:

1. A method for manufacturing a high-resistivity semiconductor-on-insulator substrate comprising the steps of:
   a) forming a dielectric layer and a semiconductor layer over a high-resistivity substrate, such that the dielectric layer is arranged between the high-resistivity substrate and the semiconductor layer;
   b) forming a hard mask or resist over the semiconductor layer, wherein the hard mask or resist has at least one opening at a predetermined position;
   c) forming at least one doped region in the high-resistivity substrate by ion implantation of an impurity element through the at least one opening of the hard mask or resist, the semiconductor layer and the dielectric layer;
   d) removing the hard mask or resist;
   e) forming a radiofrequency circuit at least one of in and on the semiconductor layer, the radiofrequency circuit at least partially overlapping the at least one doped region in the high-resistivity substrate; and
   f) forming at least one of an analog circuit and a digital circuit respectively at least one of in and on the semiconductor layer, the at least one of the analog circuit and the digital circuit being formed in an area not overlapping the doped region in the high-resistivity semiconductor-on-insulator substrate.

2. The method according to claim 1, wherein the impurity element implanted by ion implantation in step c) comprises at least one of C, Ge, O, Si, Ar, Mo and F.

3. The method according to claim 1, wherein the high-resistivity substrate comprises silicon.

4. The method according to claim 3, wherein the high-resistivity substrate comprises polycrystalline silicon.

5. The method according to claim 3, wherein the high-resistivity substrate comprises single crystal silicon.

6. The method according to claim 1, wherein the high-resistivity substrate comprises polycrystalline silicon.

7. The method according to claim 1, wherein the high-resistivity substrate comprises single crystal silicon.

8. The method according to claim 1, wherein the dielectric layer is a buried oxide layer.

9. The method according to claim 1, wherein the semiconductor layer comprises silicon.

10. The high-resistivity semiconductor-on-insulator substrate obtained by the method according to claim 1.

* * * * *